United States Patent [19]
Juntunen et al.

[11] Patent Number: 5,325,654
[45] Date of Patent: Jul. 5, 1994

[54] CARRIER TAPE WITH COVER STRIP

[75] Inventors: Timothy J. Juntunen; Dale R. Tidemann, both of Eau Claire; Joseph E. Weiler, Colfax, all of Wis.

[73] Assignee: Minnesota Mining and Manufacturing Company, St. Paul, Minn.

[21] Appl. No.: 900,423

[22] Filed: Jun. 19, 1992

[51] Int. Cl.⁵ .............................................. B65D 73/02
[52] U.S. Cl. ..................................... 53/440; 53/133.8; 53/412; 53/471; 206/332
[58] Field of Search ................... 53/440, 471, 492, 412, 53/133.8, 133.6, 553; 206/332, 328, 334, 484

[56] References Cited

U.S. PATENT DOCUMENTS

| | | | |
|---|---|---|---|
| 4,450,959 | 5/1984 | Sommer | 206/332 |
| 4,606,171 | 8/1986 | Ohshima et al. | 53/430 X |
| 4,708,245 | 11/1987 | Boeckmann et al. | 206/330 |
| 4,733,778 | 3/1988 | Boeckmann et al. | 206/332 |
| 4,736,841 | 4/1988 | Kaneko et al. | 206/328 X |
| 4,781,953 | 11/1988 | Ball | 206/328 X |
| 4,842,135 | 6/1989 | Borst et al. | 206/328 |
| 4,844,258 | 7/1989 | Boeckmann et al. | 206/328 |
| 4,898,275 | 2/1990 | Skrtic et al. | 206/332 X |
| 4,944,979 | 7/1990 | Gagliano et al. | 428/43 |
| 4,958,053 | 9/1990 | Boeckmann et al. | 206/330 |
| 4,963,405 | 10/1990 | Yamashita et al. | 428/40 |
| 5,005,275 | 4/1991 | Borst et al. | 29/235 |
| 5,064,064 | 11/1991 | Itou et al. | 206/332 X |

FOREIGN PATENT DOCUMENTS

| | | | |
|---|---|---|---|
| 2083001 | 7/1984 | United Kingdom | 73/02/ |
| 2-57575 | 2/1990 | Japan | 73/02/ |
| 4-311464 | 11/1992 | Japan | 63/10/ |
| 0466937 | 1/1992 | European Pat. Off. | 73/02/ |
| 8804458 | 6/1988 | Japan | 85/30/ |
| 4173559 | 6/1992 | Japan | 63/10/ |
| 5-51053 | 3/1993 | Japan | 73/02/ |

OTHER PUBLICATIONS

R. Prasad, Surface Mount Technology: Principles and Practices, pp. 190-192 (1989).
Research Disclosure No. 29060 (anonymous) Jun. 1988.

Primary Examiner—James F. Coan
Attorney, Agent, or Firm—Gary L. Griswold; Walter N. Kirn; Peter L. Olson

[57] ABSTRACT

A carrier tape and cover strip are provided for storing electronic components and for supplying those components seriatim to a machine. The carrier tape includes a strip portion having spaced longitudinal edge surfaces, and a plurality of pockets formed in the strip portion. The cover strip is applied over the pockets to contain electronic components therein, and is bonded along two outer bonding portions to the edge surfaces of the carrier tape. In one embodiment, the cover strip includes a tear strip attached to a medial portion of the cover strip overlying the pockets, which may be used to separate the medial portion from the bonding portions to expose the contents of the pockets.

21 Claims, 3 Drawing Sheets

CARRIER TAPE WITH COVER STRIP

TECHNICAL FIELD

This invention relates to a carrier tape for storing electronic surface mount components and for supplying those components seriatim to a machine. The carrier tape includes a cover strip for covering the individual pockets of the carrier tape.

BACKGROUND OF THE INVENTION

In the field of electronic circuit assembly, electronic components are often carried from a supply of such components to a specific location on a circuit board for attachment thereto. The components may be of several different types, including surface mount components and through-hole components. Specifically, these components may include, but are not limited to such things as memory chips, resistors, connectors, dual in-line processors (DIPS), capacitors and gate arrays. These and other components are typically affixed to a circuit board that may later be incorporated into an electronic device.

Rather than manually affixing each individual electronic component to a circuit board, the electronics industry makes extensive use of robotic placement machines, sometimes known as "pick-and-place" machines, which grasp a component at a specific location (the supply) and place it at another specific location (the circuit board). To ensure the sustained operation of such robotic placement machines, a continuous supply of electronic components must be furnished to the machine at a predetermined location in order that the robotic placement machine may be programmed to repeat a precise sequence of movements during every cycle. It is therefore important that each such component be located in the same position (i.e. the point at which the robotic placement machine grasps the component) as each preceding and succeeding component.

One way to provide a continuous supply of electronic components to a desired location is to load a series of such components into pockets that are spaced along a carrier tape. The loaded carrier tape, which is usually provided in roll form, may then be advanced toward the pick-up location at a predetermined rate as each succeeding component is removed from the tape by the robotic placement machine. Conventional carrier tapes generally comprise a self-supporting lower portion that carries the component, and a flexible cover strip that aids in preventing foreign matter from deleteriously affecting the component. The cover strip is typically bonded to the lower portion, and is progressively peeled away from the lower portion just before the robotic placement machine removes the component from the carrier tape. Alternately, a rigid reusable cover strip may be used, such as that described in U.S. Pat. Nos. 4,733,778, 4,842,135, 4,844,258, 4,958,053, and 5,005,275.

FIG. 1 illustrates a conventional carrier tape 10 in combination with a robotic placement machine 12. A supply roll 14 provides carrier tape 10 having an aligned plurality of regularly spaced pockets 16, each of which is loaded with an electronic component. A stripper assembly 18 peels the cover strip 20 from carrier tape 10 around a stripper block 22, which assists in preventing stripper assembly 18 from pulling carrier tape 10 away from its designated path. Carrier tape 10 is advanced by a sprocket 24, which engages advancement holes along at least one outer edge surface of carrier tape 10 to advance carrier tape toward robotic placement machine 12. As each successive component reaches the desired pick-up point, the robotic placement machine grasps the component (either manually or by suction) and places it on a circuit board in the appropriate location.

Electronic components may be formed by encapsulating an integrated circuit within a plastic compound. However, if the component contains entrained moisture, cracking can occur when the component is later heated for soldering to a circuit board. It is therefore desirable to remove as much entrained moisture as possible from the component in order to minimize the possibility of cracking. Moisture removal is usually done by baking or drying the components in an oven to evaporate the entrained moisture prior to soldering the components to a circuit board. Baking and drying are synonymous as used herein. The baking conditions vary with the application, and are generally divided into low temperature baking and high temperature baking. See R. Prasad, Surface Mount Technology: Principles and Practice pp. 190–92 (1989), the entire contents of which is hereby incorporated by reference. Low temperature baking typically occurs at a temperature of approximately 40° C. (±5°) at less than 5% relative humidity for a minimum period of 192 hours (8 days). Because of the extended time period required for effective low temperature baking, high temperature baking is generally preferred. High temperature baking typically occurs at a temperature of 125° C. (±5°) at less than 50%. The duration and temperature may vary from the illustrative ranges described above depending on the construction of the components, the amount of moisture present, and other operating conditions.

Components are presently baked in temperature resistant trays or tubes to remove excess moisture and then loaded into carrier tapes for storage and delivery. It would be desirable to dry the components within the carrier tape, to eliminate the intermediate processing step of loading and unloading the components from the baking trays or tubes for baking in the oven. However, carrier tapes constructed of conventional materials are generally not suitable for high temperature baking because the carrier tape and cover strip may begin to degrade at elevated temperatures. Degradation of the carrier tape may cause warping, shrinkage, or other undesirable effects that could prevent the carrier tape from being used effectively. For example, if the floor or walls of the pocket deform due to high baking temperatures, an electronic component may shift within the pocket and prevent the placement machine from grasping the component. Alternately, the cover strip could become pliable or change shape when it is heated, and could perhaps become adhered to the components within the pockets. The components may become damaged in an attempt to remove them from the cover strip, thereby rendering the components and carrier tape useless and resulting in a substantial loss for the packager.

Even if a heat-resistant carrier tape and cover strip are provided, another difficulty has been shown to render in situ baking undesirable. The adhesive that bonds the cover strip to the carrier tape tends to form a strong bond between the cover strip and the carrier tape when it is exposed to high temperatures. That is, the adhesive bonds the cover strip to the carrier tape so effectively that facile removal of the cover strip becomes difficult or impossible. For example, the cover strip may release only after the application of high peel forces, which can dislodge components that are in uncovered pockets. Alternatively, the high peel forces may cause the cover strip to tear, which could require the production line to halt in order to reattach the cover strip to the stripper assembly. Although the temperature of the baking step could be reduced in an attempt to prevent the overbonding problem, the time necessary to evaporate extant moisture correspondingly increases as described above, which slows the production process.

In view of the disadvantages of conventional carrier tapes, it is therefore desirable to provide a carrier tape and cover strip for electronic components that can withstand the temperatures encountered during the drying process and yet allow for facile removal of the cover strip to provide access to the contents of the pockets.

SUMMARY OF THE INVENTION

According to the present invention, there is provided a unitary flexible carrier tape for storage and seriatim delivery of electronic components by an advancement mechanism. The carrier tape includes a top surface having first and second parallel longitudinal edge surfaces, with at least one of the edge surfaces including means for engaging the advancement mechanism. The carrier tape also includes a plurality of pockets depending downwardly from the top surface between the edge surfaces and along the length of the carrier tape for containing the electronic components. A flexible elongate cover strip is provided to overlie the pockets, and it extends along the length of the carrier tape. The cover strip includes first and second parallel longitudinal bonding portions bonded to the first and second longitudinal edge surfaces, respectively. Also provided is means for enabling progressive separation and removal of a medial portion of the cover strip overlying the pockets from the first and second bonding portions to provide access to the pockets, which in one embodiment includes a tear tape adjoining the cover strip.

The present invention also includes a method of loading electronic components into a carrier tape for seriatim delivery by an advancement mechanism. The method includes the steps of (a) providing a unitary, flexible carrier tape, including a top surface having first and second parallel longitudinal edge surfaces, at least one of the edge surfaces including means for engaging the advancement mechanism, and a plurality of pockets depending downwardly from the top surface between the edge surfaces and along the length of the carrier tape for containing the electronic components; (b) placing an electronic component within each pocket; (c) providing a flexible elongate cover strip adapted to overlie the pockets, and having a medial portion and first and second parallel longitudinal bonding portions; (d) affixing the first bonding portion to the first longitudinal edge surface and the second bonding portion to the second longitudinal edge surface of the carrier tape to cover the pockets; and (e) drying the carrier tape within an oven to enable evaporation of entrained moisture from the electronic components. Another step in a related method includes (f) peeling the cover strip longitudinally of the carrier tape to separate the medial portion of the cover strip from the first and second bonding portions to provide access to the electronic components.

The present invention also contemplates a flexible elongate cover strip for a carrier tape having a top surface having first and second parallel longitudinal edge surfaces and a plurality of pockets formed in the top surface between the edge surfaces and along the length of the carrier tape for containing electronic components. The cover strip is adapted to overlie the pockets and to extend along the length of the carrier tape, and includes a medial portion and first and second parallel longitudinal bonding portions adapted for bonding to the first and second longitudinal edge surfaces, respectively. The cover strip further includes means for enabling separation of the medial portion overlying the pockets from the first and second bonding portions when the bonding portions are bonded to the edge surfaces to provide access to the contents of the pockets. The separation means in one embodiment comprises a tear strip adjoining the medial portion along the length of the cover strip to guide the propagation of opposed longitudinal tears in the cover strip between the tear strip and the respective bonding portions.

BRIEF DESCRIPTION OF THE DRAWINGS

The invention will be more readily understood with reference to the accompanying drawings, wherein like reference numerals refer to like components throughout the several views, and wherein.

DETAILED DESCRIPTION

Figure 1:
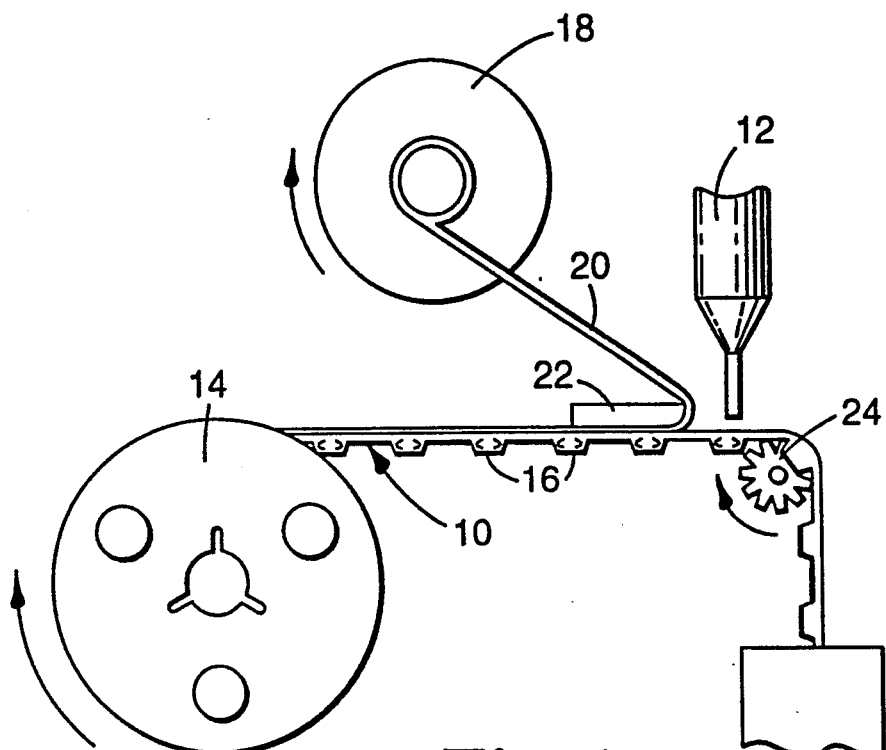
FIG. 1 is a schematic representation of a conventional carrier tape and placement machine.

The present invention relates broadly to a carrier tape having a plurality of pockets formed therein. A unitary flexible carrier tape 100 having a strip portion 102 defining a top surface is shown in FIGS. 2 through 6. Strip portion 102 includes longitudinal edge surfaces 104 and 106, and a row of aligned advancement holes 108 and 110 formed in and extending along one or both edge surfaces. Advancement holes 108 and 110 are adapted for engagement with an advancement mechanism, as shown in FIG. 1. The advancement mechanism typically comprises one sprocket for each row of advancement holes, and the teeth of each sprocket engage the holes to advance the carrier tape toward a predetermined point, at which point the robotic placement machine may grasp the individual electronic components seriatim. The holes and the spacing between adjacent holes may be varied to accommodate different types of advancement mechanisms. In one embodiment, the holes measure approximately 1.55 mm (0.061") in diameter and are regularly spaced at a distance of approximately 4 mm (0.16") on center.

Figure 2:
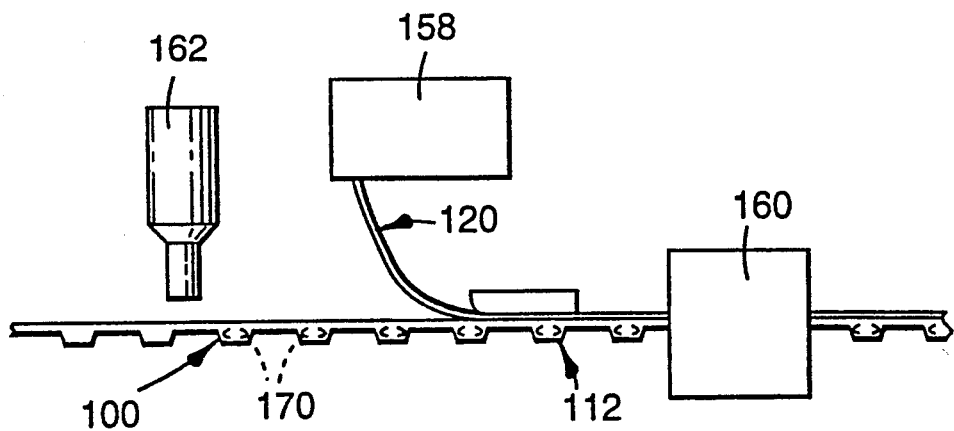
FIG. 2 is a schematic representation of a carrier tape being loaded with electronic components, having a cover strip applied, and being dried in an oven.
Figure 6:
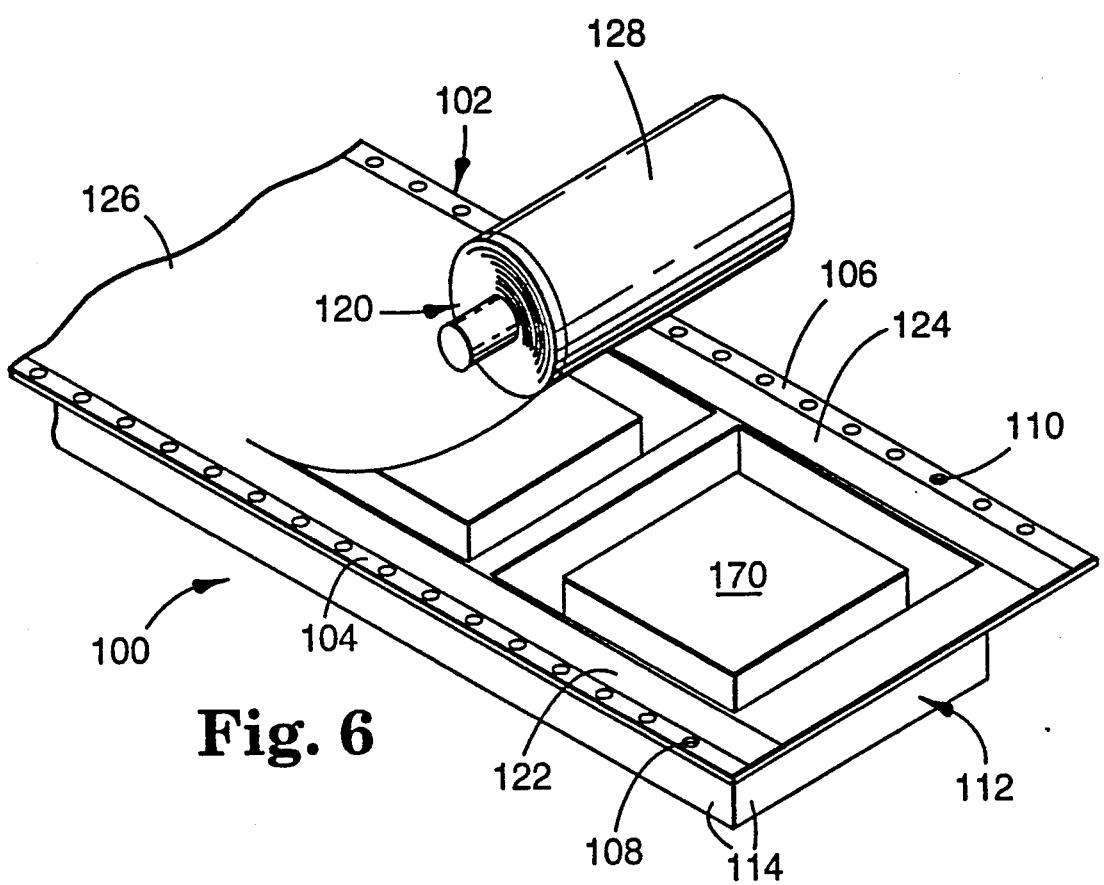
FIG. 6 is a perspective view of a carrier tape and cover strip according to the present invention, wherein a medial portion of the cover strip is being removed to expose the contents of the pockets.

Pockets 112 are formed in and spaced along strip portion 102 in one or more aligned rows, as shown in FIGS. 2 and 6. In the illustrated embodiment, each pocket includes four side walls 114 each at generally right angles with respect to each adjacent wall. Side walls 114 join and extend downwardly from the top surface of the strip portion, and join bottom wall 116 to form pocket 112. Bottom wall 116 is generally planar and parallel to the plane of strip portion 102. Each wall may also be formed with a slight draft (i.e. a 2° to 12° slant toward the center of the pocket) in order to facilitate insertion of the component, and to assist in releasing the pocket from a forming die during fabrication of the carrier tape. It is also within the range of equivalents of the present invention to provide a pocket having more or less walls than the four that are shown with reference to the preferred embodiment.

Pockets 112 are designed to conform to the size of the electronic components. Two or more columns of pockets could also be formed along the length of the carrier tape in order to facilitate the simultaneous delivery of multiple components. It is believed that a carrier tape including pockets having a longitudinal axis that extends transverse to the longitudinal axis of the tape may be more effectively rolled about a core to form a roll for storage and shipment, without bending of or damage to the pockets or the components.

In another embodiment, bottom wall 116 may comprise a lower cover strip (not shown) that is applied to form a flat-punch carrier tape. A flat-punch carrier tape includes a strip portion having a thickness slightly greater than the height of the components to be carried therein, and having holes punched therethrough corresponding to the size of the desired pocket. A lower cover strip that is applied to the bottom of the carrier tape provides bottom walls for each of the pockets. Thus the lower cover strip adjoins the side walls to form the pocket, and an upper cover strip may be sealed over the pockets to contain the components within the pockets in the manner previously described.

A particularly advantageous feature of the present invention is provided by the cover strip 120. Cover strip 120 is applied over the pockets of the carrier tape to contain the components therein. As shown in FIGS. 3 through 6, flexible, elongate cover strip 120 overlies part or all of pockets 112, and is disposed between the rows of advancement holes 108 and 110 along the length of carrier tape 100. Cover strip 120 includes parallel longitudinal bonding portions 122 and 124 that are bonded to longitudinal edge surfaces 104 and 106, respectively, of carrier tape 100. For example, a pressure sensitive adhesive, or a heat-activated adhesive such as an ethylene vinyl acetate (EVA) copolymer may be used to adhere the cover strip to edge surfaces 104 and 106.

Figure 3:
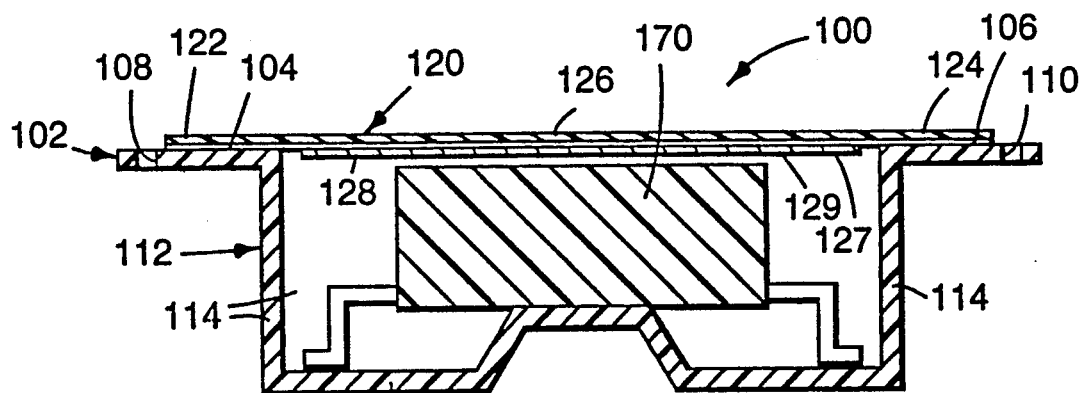
FIG. 3 is a cross-sectional view of a first embodiment of a carrier tape and cover strip according to the present invention.
Figure 4:
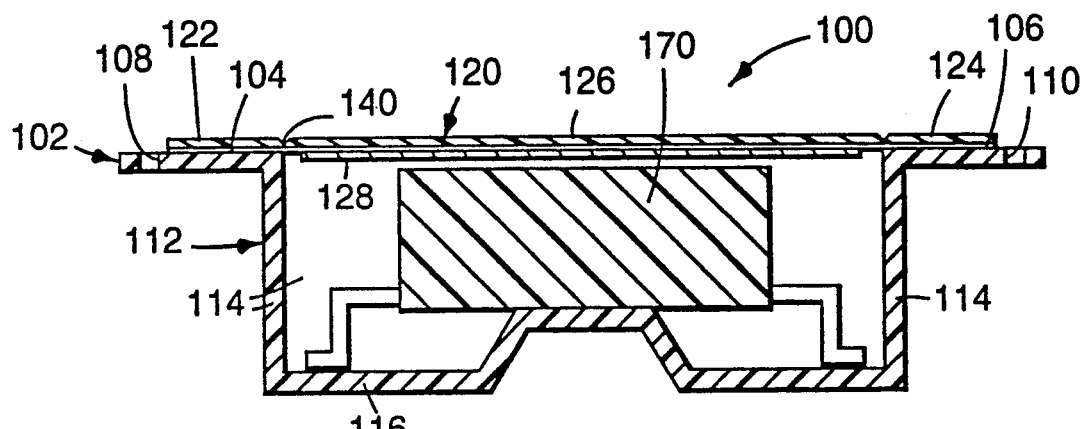
FIG. 4 is a cross-sectional view of a second embodiment of a carrier tape and cover strip according to the present invention.
Figure 5:
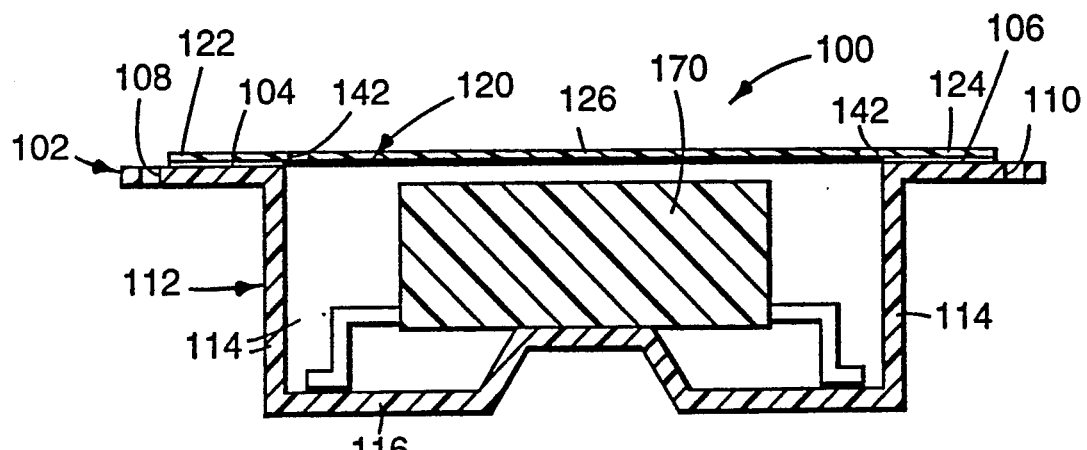
FIG. 5 is a cross-sectional view of a third embodiment of a carrier tape and cover strip according to the present invention.

Cover strip 120 also includes means for enabling separation of a medial portion 126 of cover strip 120 overlying the pockets from bonding portions 122 and 124 to provide access to the contents of the pockets. In the preferred embodiment, separation means includes a tear strip 128 applied over medial portion 126 along the length of cover strip 120, as shown in FIG. 3. Cover strip 120 is preferably constructed of a uniaxially or biaxially oriented film to facilitate downweb tearing, and to reduce or prevent transverse tearing. Tear strip 128 is resistant to tearing, and thus medial portion 126 of cover strip 120 may be peeled away from carrier tape 100, leaving bonding portions 122 and 124 attached to edge surfaces 104 and 106. Bonding portions 122 and 124 remain affixed to edge surfaces 104 and 106 due to the initial bonding of the cover strip to the carrier tape, or due to the heat encountered when the carrier tape and components are dried within an oven. Tear strip 128 also assists in guiding the propagation of opposed longitudinal tears in cover strip 120 between tear strip 128 and bonding portions 122 and 124, which exposes the contents of pockets 112.

Tear strip 128 is preferably constructed of a material such as polyester, and may be bonded to the interior surface (facing the interior of the pockets) or the exterior surface of cover strip 120. Tear strip 128 may be used to assist in separating medial portion 126 from bonding portions 122 and 124, as described above, but may also prevent electronic components from adhering to an exposed adhesive surface of cover strip 120, if such a surface faces the components. In essence, tear strip 128 acts as a deadening layer to protect the components from contacting an exposed adhesive surface.

Tear strip 128 may be provided with a metallized layer 127 on either the interior or exterior surface or both, for dissipating electricity (such as static electricity) that may be applied to the cover strip. A metallized layer may also be applied to the cover strip or to the carrier tape. The metallized layer could comprise metals such as aluminum, stainless steel, or nickel-cadmium, which are applied to the tear strip by vapor coating or sputtering. An abrasion resistant coating may be applied over the metallized layer or layers to prevent scratching or damage, which could inhibit the electrical dissipation capacity of the metallized layer. The abrasion resistant coating 129 may be provided by applying a cross-linkable acrylic material to the metallized layer, and curing the material using UV or E-beam radiation.

In another embodiment, the means for enabling separation comprises parallel lines of weakness formed in cover strip 120. Lines of weakness could comprise aligned slits, a score line having a thickness that is less than the remainder of cover strip 120 (as shown at 140 in FIG. 4), or perforations (as shown at 142 in FIG. 5). Thus when cover strip 120 is peeled from carrier tape 100, medial portion 126 is separated from bonding portions 122 and 124 along the lines of weakness, thereby exposing pockets 112. Bonding portions 122 and 124 thus remain bonded to longitudinal edge surfaces 104 and 106, respectively.

Although the cover strip and means for enabling separation of a medial portion of the cover strip from the bonding portions of the cover strip have primary applicability in the area of oven-baked carrier tapes, the present invention has utility with carrier tapes generally. The means for enabling separation may also be applied to conventional carrier tapes to provide the separation characteristics described above. In the case of conventional carrier tapes that are not subjected to heating during a drying process, the medial layer may be separation from the bonding portions in the manner described herein, or the entire cover strip may be removed by conventional separation of the bonding portions from the edge surfaces. Thus the present invention should be understood to include carrier tapes generally, as well as the specific area of oven-baked carrier tapes.

The carrier tape of the present invention could also include pockets formed in multiple columns extending along the length of the carrier tape. Cover strip 120 could be adapted to include a bonding portion between each pair of aligned columns, to enable separation of a medial portion from between each pair of bonding portions to expose the pockets.

In general, the carrier tape of the present invention is made by thermoforming pockets in a sheet of polymeric material. The polymeric sheet may be made from many different materials including, but not limited to polyester, polycarbonate, polypropylene, polystyrene, PVC (polyvinyl chloride), and ABS (acrylonitrile-butadienestyrene) copolymers. The material from which the carrier tape is constructed is preferably resistant to the deleterious effects of the heat applied during the drying process. As used herein, "deleterious effects of heating" include any significant change in the useful properties of the carrier tape or cover strip, including but not limited to embrittlement, warping, shrinkage, discoloration, and the like.

In the preferred embodiment, the polymeric sheet is electrically dissipative, and may include an electrically conductive material, such as carbon black, which is either interspersed within the material comprising the polymeric sheet, or is coated on the carrier tape either before or after the tape is formed. The electrically conductive material allows an electric charge to dissipate throughout the carrier tape and preferably to the ground. This feature may prevent damage to the components contained within the carrier tape due to an electric charge in much the same manner as the metallized layer previously described.

The polymeric sheet is supplied, either in roll form, sheet form, by continuous injection molding, or by extrusion, and conveyed to a heater, where the sheet is heated sufficiently to permit thermoforming. The temperature to which the polymeric sheet must be heated varies over a broad range depending on the gauge and type of material that is being thermoformed. Following heating, the sheet member is thermoformed by a die or dies that shape the pocket to conform to the size of the electronic component to be carried therein. The carrier tape is typically cooled after thermoforming until the polymeric material solidifies. Advancement holes are punched into the carrier tape, and any excess material, known as weed, is cut from the edges of the carrier tape to conform the carrier tape to industry standards.

As shown in FIG. 2, the formed carrier tape is loaded with components 170 by loader 162, and a cover strip 120 according to the present invention is applied by strip applicator 158 and bonded to the longitudinal edge surfaces of carrier tape 100. The loaded carrier tape may be concentrically wound about a core for storage and delivery. If the carrier tape is wound on a reel, the reel should also be resistant to the deleterious effects of high-temperature baking. The formation and loading steps associated with the carrier tape are generally known in the art, and are therefore not described in further detail herein.

After the carrier tape has been loaded and sealed with the cover strip, it is dried in oven 160. Because higher temperatures result in shorter baking times, it is desirable to bake the loaded carrier tape at a relatively high temperature (e.g. 125° C. (257° F.)) to expedite the production process. The duration of the baking step depends on the level of entrained moisture in the component, the relative humidity in the oven, and the acceptable level of entrained moisture in the component after baking. As with high temperature baking processes of the prior art, the duration may be approximately twenty-four hours. After the drying step, the carrier tape is typically loaded into a sealed, desiccated container for shipment and storage of the carrier tape and components.

In use, the carrier tape is unloaded as shown with respect to the prior art in FIG. 1. As illustrated in FIG. 6, cover strip 120 is peeled from carrier tape 100, and medial portion 126 of cover strip 120 separates from bonding portions 122 and 124 to expose components 170 within pockets 112. The bonding portions remain adhered to the edge surfaces and of carrier tape 100, and medial portion 126 may be rolled onto a take-up reel for disposal.

The present invention has now been described with reference to several embodiments thereof. It will be apparent to those skilled in the art that many changes can be made in the embodiments described without departing from the scope of the invention. For instance, other materials that are resistant to the effects of heat may be used to construct the carrier tape or cover strip or both. The carrier tape of the present invention could also be modified to incorporate two or more parallel cover strips, each of which comprises outer bonding portions and a medial portion, and each of which is bonded over a column of pockets. Hence, the scope of the present invention shall not be limited by the structures described herein, but only by structures described by the language of the claims and the equivalents of those structures.

We claim:

1. A unitary, flexible carrier tape for storage and seriatim delivery of electronic components by an advancement mechanism, the carrier tape comprising:
   (a) a top surface having first and second parallel longitudinal edge surfaces, at least one of said edge surfaces including means for engaging the advancement mechanism;
   (b) a plurality of pockets depending downwardly from said top surface between said edge surfaces and along the length of the carrier tape for containing the electronic components;
   (c) a flexible elongate cover strip overlying said pockets and extending along the length of the carrier tape, said cover strip having first and second parallel longitudinal bonding portions bonded to said first and second longitudinal edge surfaces, respectively; and
   (d) means for enabling progressive separation and removal of a medial portion of said cover strip overlying said pockets from said first and second bonding portions to provide access to the pockets.

2. The carrier tape of claim 1, wherein said carrier tape and said cover strip are constructed of a material resistant to the deleterious effects of heating to a temperature of approximately 125° C.

3. The carrier tape of claim 2, wherein said carrier tape comprises polycarbonate and said cover strip comprises polyester.

4. The carrier tape of claim 1, wherein said means for enabling separation comprises a tear strip adjoining said medial portion along the length of said cover strip to guide the propagation of opposed longitudinal tears in said cover strip between said tear strip and said respective bonding portions.

5. The carrier tape of claim 4, wherein said tear strip is bonded to a major surface of said cover strip facing the interior of said pockets.

6. The carrier tape of claim 1, wherein said carrier tape is electrically dissipative.

7. The carrier tape of claim 4, wherein at least one of said tear strip and said cover strip is coated with an electrically dissipative metallic layer.

8. The carrier tape of claim 7, wherein said metallic layer is coated with an abrasion resistant coating.

9. The carrier tape of claim 1, wherein said means for enabling separation comprises parallel lines of weakness formed in said cover strip.

10. The carrier tape of claim 1, wherein said cover strip is constructed of an oriented film adapted to facilitate downweb tearing and to aid in preventing transverse tearing of said cover strip.

11. The carrier tape of claim 1, wherein said carrier tape further comprises an electronic component disposed within each pocket.

12. The carrier tape of claim 1, wherein said plurality of pockets includes more than one aligned column of pockets extending along the length of said carrier tape, and said cover strip includes a bonding portion between each pair of said aligned columns enabling separation of a plurality of medial portions from between said bonding portions to expose said pockets.

13. A method of loading electronic components into a carrier tape for seriatim delivery by an advancement mechanism, comprising the steps of:
 (a) providing a unitary, flexible carrier tape, comprising:
  (i) a top surface having first and second parallel longitudinal edge surfaces, at least one of the edge surfaces including means for engaging the advancement mechanism, and
  (ii) a plurality of pockets depending downwardly from the top surface between the edge surfaces and along the length of the carrier tape for containing the electronic components,
 (b) placing an electronic component within each pocket;
 (c) providing a flexible elongate cover strip adapted to overlie the pockets, and having a medial portion and first and second parallel longitudinal bonding portions;
 (d) affixing the first bonding portion to the first longitudinal edge surface and the second bonding portion to the second longitudinal edge surface of the carrier tape to cover the pockets; and
 (e) drying the carrier tape within an oven to enable evaporation of entrained moisture from the electronic components.

14. The method of claim 13, further including the step of:
 (f) peeling the cover strip longitudinally of the carrier tape to separate the medial portion of the cover strip from the first and second bonding portions to provide access to the electronic components.

15. The method of claim 13, and further including the step of winding the carrier tape around a core for storage and delivery thereof.

16. A flexible elongate cover strip for a carrier tape having a top surface having first and second parallel longitudinal edge surfaces and a plurality of pockets formed in said top surface between said edge surfaces and along the length of the carrier tape for containing electronic components, said cover strip adapted to overlie the pockets and to extend along the length of the carrier tape, and including a medial portion and first and second parallel longitudinal bonding portions adapted for bonding to said first and second longitudinal edge surfaces, respectively, and further including means for enabling separation of said medial portion overlying said pockets from said first and second bonding portions when said bonding portions are bonded to said edge surfaces to provide access to the contents of the pockets.

17. The cover strip of claim 16, wherein said cover strip is constructed of an oriented film adapted to facilitate downweb tearing and to aid in preventing transverse tearing of said cover strip.

18. The cover strip of claim 17, wherein said means for enabling separation comprises a tear strip adjoining said medial portion along the length of the cover strip to guide the propagation of opposed longitudinal tears in the cover strip between said tear strip and said respective bonding portions.

19. The cover strip of claim 18, wherein said tear strip is bonded to a major surface of the cover strip facing the interior of the pockets.

20. The cover strip of claim 16, wherein at least one of said cover strip and said tear strip is electrically dissipative.

21. The cover strip of claim 16, wherein said means for enabling separation comprises parallel lines of weakness formed in said cover strip.

* * * * *

UNITED STATES PATENT AND TRADEMARK OFFICE
CERTIFICATE OF CORRECTION

PATENT NO. : 5,325,654

DATED : July 5, 1994

INVENTOR(S) : Timothy J. Juntunen, Dale R. Tidemann, and Joseph E. Weiler

It is certified that error appears in the above-indentified patent and that said Letters Patent is hereby corrected as shown below:

Col. 2, line 30, after "50%" insert --relative humidity for a period of approximately 24 hours.--.

Col. 8, line 50 after "pockets" insert --, comprising a tear strip adjoining said medial portion along the length of said cover strip to guide the propagation of opposed longitudinal tears in said cover strip between said tear strip and said respective bonding portions--.

Col. 8, lines 58-63, delete entire claim.

Col. 8, line 64, "4" should read --1--.

Col. 9, line 1, "4" should read --1--.

Col. 9, lines 6-8, delete entire claim.

Col. 10, line 28, after "pockets" insert --, said means for enabling separation comprising a tear strip adjoining said medial portion along the length of said cover strip to guide the propagation of opposed longtiudinal tears in said cover strip between said tear strip and said respective bonding portions--.

Col. 10, lines 33-38, delete entire claim.

Col. 10, line 39, "18" should read --16--.

UNITED STATES PATENT AND TRADEMARK OFFICE
CERTIFICATE OF CORRECTION

PATENT NO. : 5,325,654

DATED : July 5, 1994

INVENTOR(S) : Timothy J. Juntunen, Dale R. Tidemann, and Joseph E. Weiler

It is certified that error appears in the above-indentified patent and that said Letters Patent is hereby corrected as shown below:

Col. 10, lines 45-47, delete entire claim.

Signed and Sealed this

Twenty-fifth Day of October, 1994

Attest:

BRUCE LEHMAN

*Attesting Officer*     *Commissioner of Patents and Trademarks*